United States Patent
Sato

(10) Patent No.: US 10,290,625 B2
(45) Date of Patent: May 14, 2019

(54) INSULATED GATE SEMICONDUCTOR DEVICE

(71) Applicant: FUJI ELECTRIC CO., LTD., Kawasaki-shi, Kanagawa (JP)

(72) Inventor: Shigeki Sato, Nagano (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/890,723

(22) Filed: Feb. 7, 2018

(65) Prior Publication Data

US 2018/0166436 A1 Jun. 14, 2018

Related U.S. Application Data

(63) Continuation of application No. PCT/JP2017/000053, filed on Jan. 4, 2017.

(30) Foreign Application Priority Data

Feb. 18, 2016 (JP) .................. 2016-029355

(51) Int. Cl.
| | | |
|---|---|---|
| *H01L 27/00* | (2006.01) | |
| *H01L 27/02* | (2006.01) | |
| *H01L 27/06* | (2006.01) | |
| *H01L 29/739* | (2006.01) | |
| *H01L 29/866* | (2006.01) | |

(Continued)

(52) U.S. Cl.
CPC ...... *H01L 27/0248* (2013.01); *H01L 27/0647* (2013.01); *H01L 29/7393* (2013.01);
(Continued)

(58) Field of Classification Search
CPC ......... H03K 17/08128; H03K 17/0828; H03K 2017/0806; H01L 29/866; H01L 27/0248;
(Continued)

(56) References Cited

U.S. PATENT DOCUMENTS

| | | |
|---|---|---|
| 5,631,494 A | 5/1997 | Sakurai et al. |
| 7,482,659 B2 | 1/2009 | Hotta |

(Continued)

FOREIGN PATENT DOCUMENTS

| | | |
|---|---|---|
| JP | H04-322126 A | 11/1992 |
| JP | H06-318678 A | 11/1994 |

(Continued)

*Primary Examiner* — Ahmed N Sefer
(74) *Attorney, Agent, or Firm* — Rabin & Berdo, P.C.

(57) ABSTRACT

An insulated gate semiconductor device includes a main insulated gate transistor having a gate electrode controlling a main current, a current-detecting insulated gate transistor, which is disposed in parallel to a main insulated gate transistor, outputting a current on a proportional basis in size between the transistors to the main current flowing through the main insulated gate transistor, a temperature detecting diode formed integrally with these insulated gate transistors in a semiconductor substrate. Interposing an ESD tolerance Zener diode between an emitter electrode of the current-detecting insulated gate transistor and an anode electrode of the temperature detecting diode leads to securing the ESD tolerance for the current-detecting insulated gate transistor by using the temperature detecting diode.

4 Claims, 3 Drawing Sheets

(51) Int. Cl.
*H03K 17/0812* (2006.01)
*H03K 17/082* (2006.01)
*H03K 17/08* (2006.01)

(52) U.S. Cl.
CPC ....... *H01L 29/866* (2013.01); *H03K 17/0828* (2013.01); *H03K 17/08128* (2013.01); *H01L 27/0629* (2013.01); *H03K 2017/0806* (2013.01)

(58) Field of Classification Search
CPC ............. H01L 27/0647; H01L 29/7393; H01L 27/0629
See application file for complete search history.

(56) References Cited

U.S. PATENT DOCUMENTS

| | | |
|---|---|---|
| 8,598,942 B2 | 12/2013 | Kawashima |
| 2004/0051145 A1 | 3/2004 | Nobe et al. |
| 2007/0159751 A1 | 7/2007 | Hussein et al. |
| 2008/0117557 A1 | 5/2008 | Mamitsu |
| 2013/0257517 A1* | 10/2013 | Kawashima ........... G01R 19/32 327/513 |
| 2018/0097514 A1* | 4/2018 | Ishii .......................... F02P 11/00 |
| 2018/0175849 A1* | 6/2018 | Shimizu .................. H02M 1/08 |

FOREIGN PATENT DOCUMENTS

| | | |
|---|---|---|
| JP | H07-086587 A | 3/1995 |
| JP | 2004-515911 A | 5/2004 |
| JP | 2007-158134 A | 6/2007 |
| JP | 2007-266089 A | 10/2007 |
| JP | 2007-287919 A | 11/2007 |
| JP | 2008-041948 A | 2/2008 |
| JP | 2008-042950 A | 2/2008 |
| JP | 2008-153615 A | 7/2008 |
| JP | 2010-263032 A | 11/2010 |
| WO | WO-2013/005520 A1 | 1/2013 |

* cited by examiner

INSULATED GATE SEMICONDUCTOR DEVICE

TECHNICAL FIELD

The present invention relates to an insulated gate semiconductor device with an unsophisticated constitution in which an electro-static countermeasure is provided.

BACKGROUND ART

On a power conversion apparatus such as an inverter and the like, an insulated gate transistor such as IGBT or MOSFET is employed as a semiconductor switching element that controls a supply current flowing to a load. Moreover, the power conversion apparatus often integrates a current detecting element in which the current detecting element detects a current supplied to the load side through the insulated gate transistor to protect the insulated gate transistor and the like from suffering overcurrent.

At this point, the current detecting element is realized as a current-detecting insulated gate transistor (so-called a sense IGBT) 2 that is disposed in parallel to a main insulated gate transistor (main IGBT) 1 being an IGBT that controls a main current as shown in FIG. 3 and that outputs another current on a proportional basis in size between the transistors to the main current flowing through the main insulated gate transistor 1. Concretely, the current-detecting insulated gate transistor 2 is installed so that a collector electrode and a gate electrode thereof are connected to another collector electrode and another gate electrode of the main insulated gate transistor 1, respectively.

In this regard, the current-detecting insulated gate transistor 2 is entirely integrated in single-piece construction with the main insulated gate transistor 1 into a semiconductor substrate (not shown) such as Si or SiC, for example, resulting in materializing an insulated gate semiconductor device 33. In addition, the current-detecting insulated gate transistor 2 outputs the current being on a proportional basis in size between the transistors to the main current flowing through the main insulated gate transistor 1 from the emitter electrode thereof. And then, with regard to the insulated gate semiconductor device 33, there are provided external connection terminals connected to the collector electrode, the emitter electrode, and the gate electrode of the main insulated gate transistor 1, as well as the emitter electrode of the current-detecting insulated gate transistor 2, respectively.

Moreover, this kind of insulated gate semiconductor device 33 is configured so that a temperature detecting diode 4 is often installed to detect an operating temperature of the main insulated gate transistor 1. In addition, a Zener diode (ZD) 5 is generally connected in parallel with the temperature detecting diode 4 in order to prevent a malfunction caused by noises output from the temperature detecting diode 4 while regulating a voltage applied to the temperature detecting diode 4 and to compensate for temperature properties of the temperature detecting diode 4. The insulated gate semiconductor device 33 with this configuration is introduced in detail, for example, in Patent Literature 1 (see FIG. 2 of Patent Literature 1).

The insulated gate semiconductor device 33 is configured so that the main insulated gate transistor 1 is turned on and off by using a control circuit 14 comprising a driving circuit 11, a current detecting circuit 12, and a temperature detecting circuit 13. The driving circuit 11 applies a driving signal to the gate electrode of the main insulated gate transistor 1 via an output transistor 15, being, for example, a p-type MOSFET, and then turns on and off the main insulated gate transistor 1.

Furthermore, the current detecting circuit 12 monitors the main current flowing through the main insulated gate transistor 1 while detecting a voltage converted from the current output through the emitter electrode of the current-detecting insulated gate transistor 2 via a current detecting resistance (Rs) 16. Then, the current detecting circuit 12 controls the driving circuit 11 to suspend, turning off the main insulated gate transistor 1. This prevents the main insulated gate transistor 1 from suffering overcurrent disruption owing to an excessively high current.

In addition, the temperature detecting circuit 13 detects an operating temperature of the insulated gate semiconductor device 33 based on still another current flowing through the temperature detecting diode 4 and another operating temperature of the insulated gate transistor 1 consequently. Then the control circuit 14 controls the driving circuit 11 to suspend, turning off the main insulated gate transistor 1 when an abnormal temperature increase is detected by the temperature detecting circuit 13. This prevents the main insulated gate transistor 1 from suffering overheat disruption.

In this regard, on the insulated gate semiconductor device 33 described above, there is a problem that electro-static discharge (ESD), which is determined based on the Machine Model (MM) or the Human Body Model (HBM), may produce dielectric breakdown to a gate oxide and an interlayer dielectric film in the insulated gate semiconductor device. The current-detecting insulated gate transistor 2 is designed as an element feeding about one-several hundredth to one-ten thousandth of current on a proportional basis to the main current flowing in the main insulated gate transistor 1. Then an area of the current-detecting insulated gate transistor 2, as viewed from a cross-section of the transistor 2, is approximately one-several hundredth to one-ten thousandth of the main insulated gate transistor 1. And then a value of parasitic capacitance created in the gate oxide or the interlayer dielectric film is on a proportional basis in size between the insulated gate transistors. As a result, ESD tolerance decreases remarkably in the current-detecting insulated gate transistor 2 when compared with that of the main insulated gate transistor 1.

On the other hand, a technical method is known as a means for improving ESD tolerance so that a diode for protecting electro-static discharge is interposed as described in Patent Literature 2 to protect the current-detecting insulated gate transistor 2 without changing output characteristics thereof by dimensions of a junction area with respect to a pn junction as well as by a static breakdown voltage of the diode (see FIG. 1 in Patent Literature 2).

CITATION LIST

Patent Literature

Patent Literature 1: WO 2013/005520 pamphlet
Patent Literature 2: JP-A 2010-263032

DISCLOSURE OF INVENTION

Problems to be Solved by the Invention

However, when interposing the diode for protecting electro-static discharge between the emitter electrode and the gate electrode of the current-detecting insulated gate transistor 2, being a sense IGBT, the diode for protecting electro-static discharge requires particular dimensions of the junction area with respect to the pn junction, as well as the static breakdown voltage, to ensure a desired ESD tolerance. Therefore, it is necessary that Zener diodes, which have predetermined breakdown voltage characteristics, for example, are disposed so as to be connected in series. Since the diode for protecting from electro-static discharge is formed of multiple Zener diodes, the diode for protecting electro-static discharge (multiple Zener diodes) increases the footprint of the insulated gate semiconductor device 33, being an IGBT chip. By force of necessity, this results in enlarging the size of the IGBT chip (the insulated gate semiconductor device) 33.

The present invention is provided in view of the circumstance described above. Then, with respect to an insulated gate semiconductor device comprising a main insulated gate transistor and a current-detecting insulated gate transistor outputting a current on a proportional basis in size between the transistors to the main current flowing through the main insulated gate transistor, it is an object of the present invention to provide the insulated gate semiconductor device having in particular an unsophisticated constitution (e.g. not requiring multiple additional electrical elements or complex electrical elements) with an improved ESD tolerance for the current-detecting insulated gate transistor.

Means for Solving Problems

The present invention is made by focusing attention on that the insulated gate semiconductor device, which is configured to comprise the main insulated gate transistor and the current-detecting insulated gate transistor provided in parallel to the main insulated gate transistor, further comprises a temperature detecting diode generally.

More specifically, an insulated gate semiconductor device according to one aspect of the present invention comprises: a main insulated gate transistor (main IGBT) including a gate electrode controlling a main current flowing between a collector electrode and an emitter electrode; and a current-detecting insulated gate transistor (sense IGBT) outputting a current from another emitter electrode on a proportional basis in size between the transistors to the main current flowing through the main insulated gate transistor (main IGBT), wherein the current-detecting insulated gate transistor is configured so that another collector electrode and another gate electrode thereof are connected to the collector electrode and the gate electrode of the main insulated gate transistor, respectively. In addition, the insulated gate semiconductor device is configured to comprise: a temperature detecting diode having an anode electrode and a cathode electrode, wherein the temperature detecting diode is formed integrally with the main insulated gate transistor and the current-detecting insulated gate transistor in the same substrate.

In order to achieve the object of the invention described above, the insulated gate semiconductor device according to the one aspect of the present invention comprises in particular an ESD tolerance Zener diode in the substrate, wherein the ESD tolerance Zener diode is configured so that the anode electrode thereof is connected to the emitter electrode of the current-detecting insulated gate transistor and the cathode thereof is connected to the anode electrode of the temperature detecting diode.

In the insulated gate semiconductor device according to the above aspect of the invention, each of a plurality of connection terminals being mutually independent may be connected to each one of the collector electrode, the emitter electrode, and the gate electrode of the main insulated gate transistor, as well as the emitter electrode of the current-detecting insulated gate transistor and then the anode electrode and the cathode electrode of the temperature detecting diode.

In the insulated gate semiconductor device according to the above aspect of the invention, preferably, the temperature detecting diode may be formed in the substrate so as to be connected in parallel with an overvoltage protection Zener diode defining a voltage applied to the temperature detecting diode.

In the insulated gate semiconductor device according to the above aspect of the invention, the insulated gate semiconductor device may further comprise an electro-static discharge Zener diode in which the anode electrode thereof may be connected to the emitter electrode of the current-detecting insulated gate transistor and the cathode electrode thereof may be connected to the gate electrode of the current-detecting insulated gate transistor.

Effect of the Invention

According to the insulated gate semiconductor device configured as described above, it is possible to utilize the temperature detecting diode for ensuring ESD tolerance of the current-detecting insulated gate transistor when employing such an unsophisticated constitution that the ESD tolerance Zener diode is interposed between the emitter electrode of the current-detecting insulated gate transistor and the anode of the temperature detecting diode. Namely, the configuration described above leads to a multiplier effect that the ESD tolerance of the current-detecting insulated gate transistor is aided by the ESD tolerance of the temperature detecting diode. As a result, an improvement effect is achieved in that a conventional relationship that the ESD tolerance of the current-detecting insulated gate transistor is less than the ESD tolerance of the temperature detecting diode can be changed to another relationship that the ESD tolerance of the temperature detecting diode is less than the sum of the ESD tolerance of the current-detecting insulated gate transistor and the ESD tolerance of the temperature detecting diode. This leads to an improvement in the ESD tolerance of the current-detecting insulated gate transistor, so that the ESD tolerance of the current-detecting insulated gate transistor increases by 3 times and the ESD tolerance of the temperature detecting diode by 1.5 times when compared with those of a conventional art, respectively.

Consequently, with respect to the insulated gate semiconductor device comprising the main insulated gate transistor, the current-detecting insulated gate transistor, and the temperature detecting diode, it is possible to ensure the ESD tolerance sufficiently against the current-detecting insulated gate transistor although there is the unsophisticated constitution so that the ESD tolerance diode is further provided as described earlier. In addition, as one ESD tolerance Zener diode, for example, is just added, a significant effect is provided in practical use so that the insulated gate semiconductor device can be miniaturized in size and so on when comparing with a case that multiple Zener diodes are provided with multi-stages for protecting against electro-static discharge between the gate electrode and the emitter electrode of the current-detecting insulated gate transistor.

MODES FOR CARRYING OUT THE INVENTION

Hereinafter, an insulated semiconductor device according to one embodiment of the present invention will be described with references to the accompanying drawings.

Figure 1:
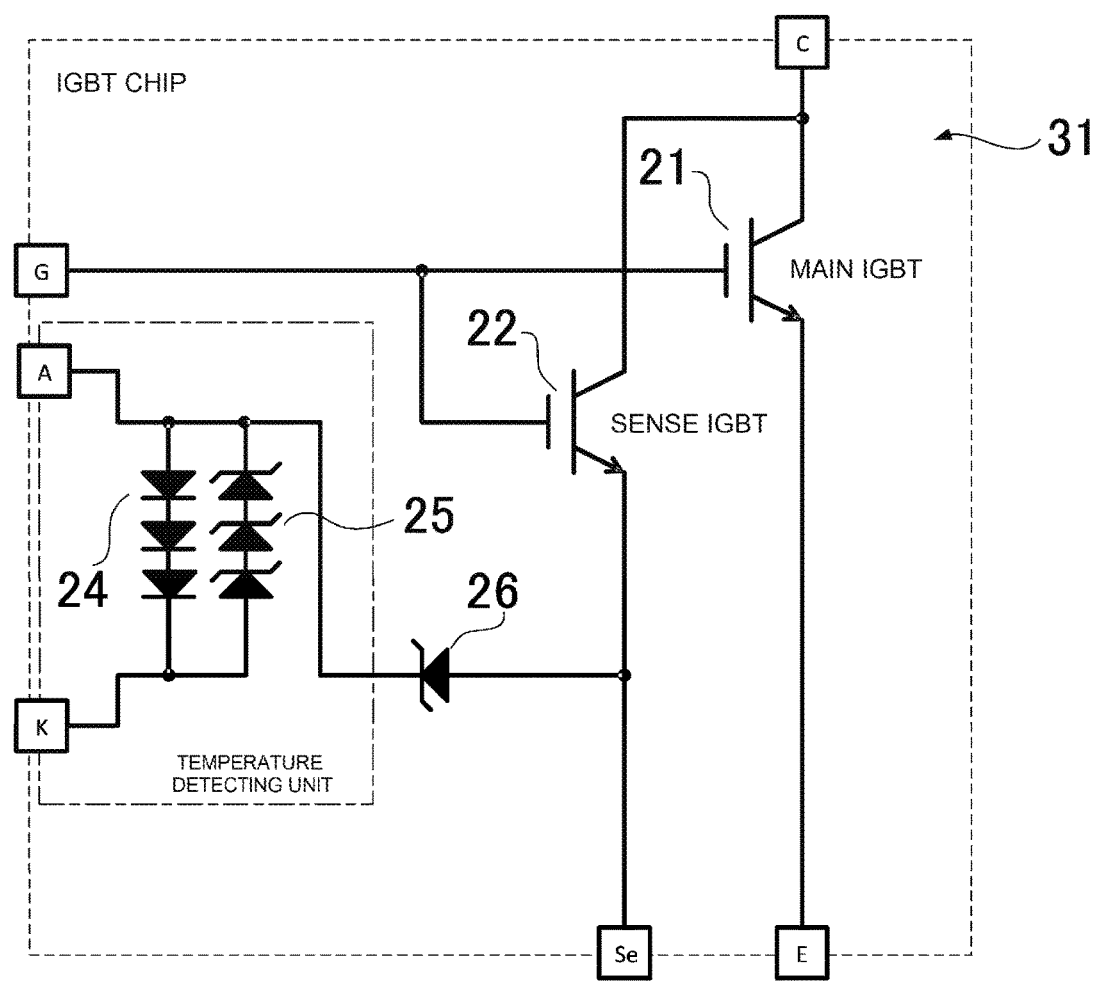
FIG. 1 illustrates a schematic configuration of an insulated gate semiconductor device according to one embodiment of the present invention.
Figure 2:
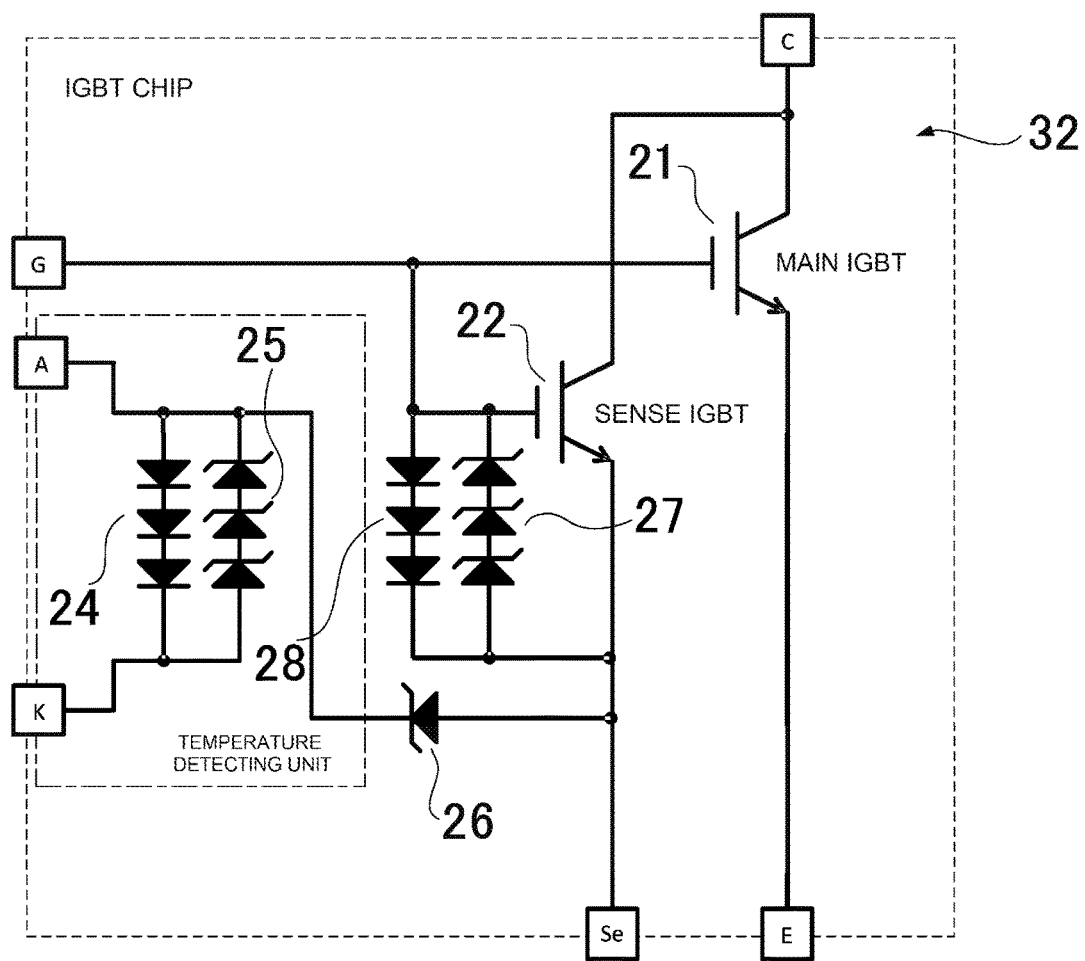
FIG. 2 illustrates another schematic configuration of another insulated gate semiconductor device according to another embodiment of the present invention.
Figure 3:
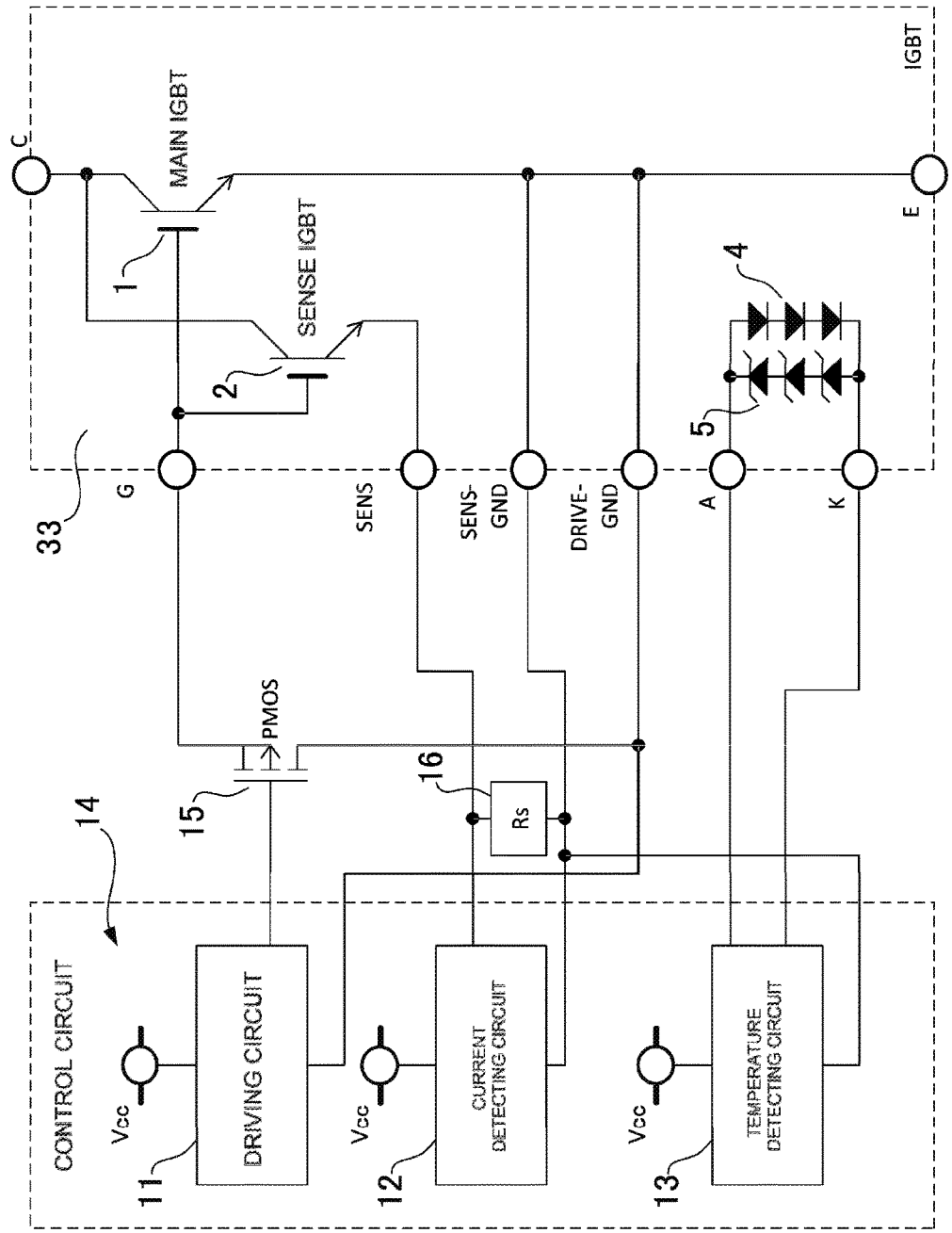
FIG. 3 illustrates a schematic configuration of a conventional insulated gate semiconductor device and a control device thereof as an example.

FIG. 1 illustrates a schematic configuration of an insulated gate semiconductor device 31 according to the one embodiment of the present invention. The terminals G, A, and K of FIG. 1, and FIG. 2, are output terminals of the insulated gate semiconductor devices 31 and 32, and are configured to connect to a control circuit including a driving circuit, a current-detecting circuit, and a temperature-detecting circuit, respectively. Likewise, the terminals C, E, and Se are terminals of the insulated gate semiconductor devices 31 and 32 and correspond to a collector terminal, emitter terminal, and sense IGBT emitter terminal.

The insulated gate semiconductor device 31 according to one embodiment comprises an ESD tolerance Zener diode 26, which is interposed between an emitter electrode of a current-detecting insulated gate transistor (hereinafter, described as a sense IGBT) 22 and an anode electrode of a temperature detecting diode 24 as shown in FIG. 1. In particular, an anode electrode of the ESD tolerance Zener diode 26 is connected to the emitter electrode of the current-detecting insulated gate transistor 22 and then a cathode electrode of the ESD tolerance Zener diode 26 is connected to the anode electrode of the temperature detecting diode 24.

In this regard, the ESD tolerance Zener diode 26 is formed in the same substrate in conjunction with a main insulated gate transistor (hereinafter, described as a main IGBT) 21, the sense IGBT 22, the temperature detecting diode 24, and the like. Then, the semiconductor substrate in which these elements are fabricated makes up the insulated gate semiconductor device 31, which is an IGBT chip, and which is integrated into a module, such a module including a control circuit together with the IGBT chip.

In this case, the main IGBT 21 and the sense IGBT 22 in the insulated gate semiconductor device (hereinafter, described as the IGBT chip) 31 are configured to form a collector region and an emitter region in a surface layer of the semiconductor substrate being a body of the IGBT chip 31, and then an element structure is created so that a gate electrode is fabricated via a dielectric layer on the collector region and the emitter region. Moreover, the temperature detecting diode 24 is formed in the vicinity of the main IGBT 21 and the sense IGBT 22 in the surface layer of the semiconductor substrate. Then the ESD tolerance Zener diode 26 is formed so as to connect the emitter region of the sense IGBT 22 with the anode region of the temperature detecting diode 24 in the surface layer of the semiconductor substrate.

Even though electro-static discharge is applied from an external part into the IGBT chip 31, leading to higher surface potential of the semiconductor substrate, the IGBT chip 31 configured as described above works so that a voltage caused from electro-static energy thereof is absorbed by the temperature detecting diode 24. Consequently, a potential of the emitter electrode of the sense IGBT 22, which is connected to the anode electrode of the temperature detecting diode 24 through the ESD tolerance Zener diode 26, is also kept low. As a result, another voltage applied between the emitter electrode and the gate electrode of the sense IGBT 22 can be curbed low, preventing the sense IGBT 22 from suffering electro-static discharge failure.

Namely, the temperature detecting diode 24 can receive a high voltage electro-static discharge applied to the IGBT 31 via the ESD tolerance Zener diode 26. As a result, the voltage caused by electro-static discharge applied between the gate electrode and the emitter of the sense IGBT 22 can be curbed low. Therefore, when ESD tolerance of the temperature detecting diode 24 is used effectively, electro-static discharge failure of the sense IGBT 22 can be prevented in an efficient manner.

Furthermore the IGBT chip 31 configured as described above does not require any complex circuitry, since the ESD tolerance Zener diode 26 is interposed between the emitter electrode of the sense IGBT 22 and the anode electrode of the temperature detecting diode 24. Therefore, a significant effect is provided in practical use such that the insulated gate semiconductor device 31 can be miniaturized in size when comparing with a conventional art that multiple Zener diodes are disposed with multi-stages between the gate electrode and the emitter electrode of the sense IGBT 22 for protecting against electro-static discharge.

Further the present invention is not limited to the embodiments described above. As shown in FIG. 2, according to another embodiment, an insulated gate semiconductor device 32 includes an electro-static discharge Zener diode 27 provided between the emitter electrode and the gate electrode of the sense IGBT 22 in addition to the ESD tolerance Zener diode 26. In this case, preferably a diode 28 may be disposed in reverse parallel connection to the electro-static discharge Zener diode 27, preventing a gate voltage applied to the gate electrode of the sense IGBT 22 from increasing involuntary owing to electro-static discharge.

The electro-static discharge Zener diode 27, which is provided with the diode 28 in parallel manner, is realized as a similar element structure that the temperature detecting diode 24 is provided with a Zener diode (ZD) 25 in parallel manner as a matter of principle. Therefore, a problem hardly occurs when the electro-static discharge Zener diode 27, which is provided with the diode 28 in parallel manner, is integrated into the IGBT chip 32. Then this results in increasing only a slight level in a chip area of the IGBT chip 32 due to the addition described above. Each of the temperature detecting diode 24, the Zener diode 25, the electro-static discharge Zener diode 27 and the diode 28 may include one or more diodes, as illustrated in FIGS. 1 and 2.

Furthermore it is sufficient that a reverse breakdown voltage of the electro-static discharge Zener diode 27, which is interposed between the emitter electrode and the gate electrode of the sense IGBT 22, has the order of 30V corresponding to a driving voltage of the IGBT chip 32 in general. However, if an initial screening test, namely a gate shock test, for gate oxides of the main IGBT 21 and the sense IGBT 22 is taken in consideration, it is desirable that the reverse breakdown voltage of the electro-static discharge Zener diode 27 is set to be, for example, equal to or more than 54V, which corresponds to the testing voltage thereof. Moreover, if a time zero dielectric breakdown (TZDB) test or a time dependent dielectric breakdown (TDDB) test, which is a reliability test of the gate oxide, is taken in consideration, it is desirable that the reverse breakdown voltage of the electro-static discharge Zener diode 27 is set to be, for example, equal to or more than 54V, which corresponds to the testing voltage thereof.

However, as the ESD tolerance of the sense IGBT 22 is ensured by utilizing the temperature detecting diode 24, it is assured even if the reverse breakdown voltage of the electro-static discharge Zener diode 27 is not as high as that described above. The present invention is not limited to the above description and changeable variously within the scope being not deviated from the gist thereof.

EXPLANATION OF LETTERS OR NUMERALS

21. main insulated gate transistor (main IGBT)
22. current-detecting insulated gate transistor (sense IGBT)
24. temperature detecting diode
25. Zener diode (ZD)
26. ESD tolerance Zener diode
27. electro-static discharge Zener diode
11. driving circuit
12. current detecting circuit
13. temperature detecting circuit
14. control circuit
15. output transistor (MOSFET)
16. current detecting resistance (Rs)
31, 32, 33. insulated gate semiconductor device (IGBT chip)

The invention claimed is:

1. An insulated gate semiconductor device comprising:
a main insulated gate transistor including a gate electrode controlling a main current flowing between a collector electrode and an emitter electrode;
a current-detecting insulated gate transistor including another emitter electrode, another collector electrode, and another gate electrode, the current-detecting insulated gate transistor configured to output a second current from the another emitter electrode, the second current being proportional to the main current flowing through the main insulated gate transistor, wherein the current-detecting insulated gate transistor is configured so that the another collector electrode and the another gate electrode are connected to the collector electrode and the gate electrode of the main insulated gate transistor, respectively;
a temperature detecting diode having a first anode electrode and a first cathode electrode, wherein the temperature detecting diode is formed integrally in conjunction with the main insulated gate transistor and the current-detecting insulated gate transistor in one semiconductor substrate; and
an electro-static discharge (ESD) tolerance Zener diode formed integrally in the semiconductor substrate, and having a second anode electrode and a second cathode electrode, wherein the ESD tolerance Zener diode is configured so that the second anode electrode is connected to the another emitter electrode of the current-detecting insulated gate transistor and the second cathode electrode is connected to the first anode electrode of the temperature detecting diode.

2. The insulated gate semiconductor device according to claim 1, wherein each of a plurality of connection terminals being mutually independent is connected individually to each of the collector electrode, the emitter electrode, and the gate electrode of the main insulated gate transistor, as well as the another emitter electrode of the current-detecting insulated gate transistor and to each of the first anode electrode and the first cathode electrode of the temperature detecting diode.

3. The insulated gate semiconductor device according to claim 1, wherein the temperature detecting diode is formed integrally in the semiconductor substrate so as to be connected in parallel with an overvoltage protection Zener diode determining a voltage applied to the temperature detecting diode.

4. The insulated gate semiconductor device according to claim 1, further comprising:
an electro-static discharge Zener diode configured integrally in the semiconductor substrate and having a third anode electrode and a third cathode electrode, wherein the third anode electrode is connected to the another emitter electrode of the current-detecting insulated gate transistor and the third cathode electrode is connected to the another gate electrode of the current-detecting insulated gate transistor.

* * * * *